(12) United States Patent
Shini et al.

(10) Patent No.: US 11,527,477 B2
(45) Date of Patent: Dec. 13, 2022

(54) SEMICONDUCTOR DEVICE AND METHOD OF MANUFACTURING SEMICONDUCTOR DEVICE

(71) Applicant: Kioxia Corporation, Tokyo (JP)

(72) Inventors: Masato Shini, Mie Mie (JP); Yasunori Okayama, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 14 days.

(21) Appl. No.: 17/010,449

(22) Filed: Sep. 2, 2020

(65) Prior Publication Data

US 2021/0287995 A1 Sep. 16, 2021

(30) Foreign Application Priority Data

Mar. 16, 2020 (JP) .............................. JP2020-045738

(51) Int. Cl.
*H01L 23/532* (2006.01)
*H01L 21/768* (2006.01)
*H01L 23/522* (2006.01)

(52) U.S. Cl.
CPC .... *H01L 23/53295* (2013.01); *H01L 21/7682* (2013.01); *H01L 21/76802* (2013.01); *H01L 21/76831* (2013.01); *H01L 23/5222* (2013.01); *H01L 23/5226* (2013.01)

(58) Field of Classification Search
CPC ........... H01L 21/7682; H01L 21/76802; H01L 21/76834; H01L 23/5222; H01L 23/53295
See application file for complete search history.

(56) References Cited

U.S. PATENT DOCUMENTS

| | | | | |
|---|---|---|---|---|
| 5,656,543 A | * | 8/1997 | Chung | H01L 23/5226 257/E21.589 |
| 5,880,026 A | * | 3/1999 | Xing | H01L 23/5222 438/619 |
| 6,577,011 B1 | * | 6/2003 | Buchwalter | H01L 21/7682 257/E23.161 |
| 7,026,235 B1 | * | 4/2006 | Ben-Tzur | H01L 23/5222 438/619 |
| 7,030,005 B2 | * | 4/2006 | Lee | H01L 21/7682 438/618 |
| 7,473,632 B2 | * | 1/2009 | Ueda | H01L 23/5222 438/618 |
| 2004/0137728 A1 | | 7/2004 | Gallagher et al. | |
| 2005/0037604 A1 | * | 2/2005 | Babich | H01L 21/7681 438/619 |
| 2005/0062165 A1 | * | 3/2005 | Saenger | H01L 23/5222 438/622 |
| 2011/0171823 A1 | | 7/2011 | Hussein et al. | |
| 2014/0159194 A1 | | 6/2014 | Song et al. | |
| 2022/0084881 A1 | * | 3/2022 | Zhu | H01L 28/60 |

FOREIGN PATENT DOCUMENTS

JP 4574145 B2 11/2010

* cited by examiner

*Primary Examiner* — Jaehwan Oh
*Assistant Examiner* — John M Parker
(74) *Attorney, Agent, or Firm* — Foley & Lardner LLP (57) ABSTRACT

A semiconductor device including a plurality of wirings and an insulating space is described. The insulating space is disposed between adjacent wirings of the plurality of wirings. An insulating material surrounds the insulating space. The insulating space is filled with air at a pressure no more than an atmospheric pressure.

12 Claims, 7 Drawing Sheets

SEMICONDUCTOR DEVICE AND METHOD OF MANUFACTURING SEMICONDUCTOR DEVICE

CROSS-REFERENCE TO RELATED APPLICATION

This application is based upon and claims the benefit of priority from Japanese Patent Application No. 2020-045738, filed Mar. 16, 2020, the entire contents of which are incorporated herein by reference.

FIELD

Embodiments described herein relate generally to a semiconductor device and a method of manufacturing a semiconductor device.

BACKGROUND

In the related art, in a semiconductor device, a reduction in wiring interval and an increase in the number of wiring layers progress. In a semiconductor device, a technique of reducing the wiring capacitance is considered.

DETAILED DESCRIPTION

At least one embodiment provides a semiconductor device having a low wiring capacitance and a method of manufacturing the semiconductor device.

In general, according to at least one embodiment, there is provided a semiconductor device including a plurality of wirings and an insulating space. The insulating space is disposed between adjacent wirings of the plurality of wirings. An insulating material surrounds the insulating space. The insulating space is filled with air at a pressure no more than an atmospheric pressure.

Hereinafter, a semiconductor device and a method of manufacturing the semiconductor device according to an embodiment will be described with reference to the drawings.

First Embodiment

Figure 1:
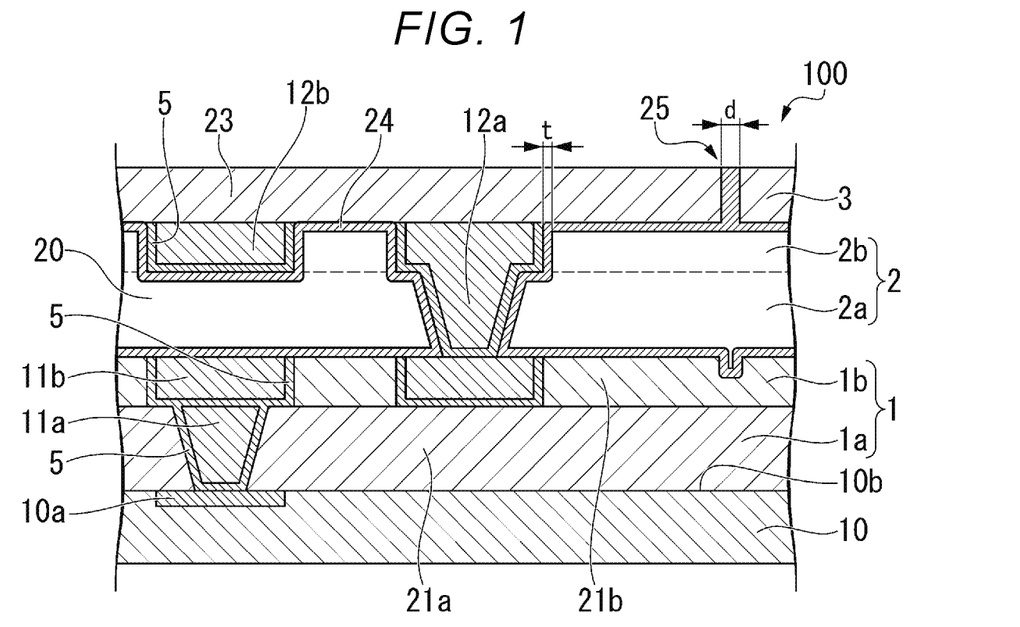
FIG. 1 is a schematic cross-sectional view illustrating a semiconductor device according to a first embodiment.

FIG. 1 is a schematic cross-sectional view illustrating a semiconductor device according to a first embodiment. A semiconductor device 100 illustrated in FIG. 1 includes: a substrate 10; a second layer 2 including an insulating space 20; a first layer 1 disposed on the substrate 10 side of the second layer 2; and a third layer 3 disposed on a side of the second layer 2 opposite to the substrate 10. The semiconductor device 100 includes multiple wiring layers including the first layer 1, the second layer 2, and the third layer 3.

As the substrate 10, for example, a silicon wafer on which elements such as a transistor are provided may be used. In the semiconductor device 100 illustrated in FIG. 1, an insulating region 10b and a contact pad 10a are provided on a surface of the substrate 10. For example, the insulating region 10b is formed with an insulating film formed of a well-known insulating material such as $SiO_2$. The contact pad 10a is electrically connected to an electrode of a transistor through a through via that is embedded into a contact hole penetrating the insulating film. As the contact pad 10a, for example, a contact pad formed of a well-known conductive material such as $CoSi_2$ or $NiSi_2$ may be used.

The first layer 1 is provided on the substrate 10. As illustrated in FIG. 1, the first layer 1 has a two-layer structure in which a 1-1 layer 1a disposed on the substrate 10 side and a 1-2 layer 1b disposed on the second layer 2 side are stacked.

The 1-1 layer 1a includes: a plurality of first wirings 11a (in FIG. 1, only one first wiring 11a is illustrated); and a first insulating film 21a formed of an insulating material such as $SiO_2$ or SiN. The first wiring 11a is formed of Cu, in which a surface on the substrate 10 side and a side surface are covered with a barrier layer 5 formed of a Ti film or a TiN film. The first wiring 11a is a through wiring embedded into a contact hole penetrating the first insulating film 21a. As illustrated in FIG. 1, each of the first wirings 11a is electrically connected to the contact pad 10a of the substrate 10.

The 1-2 layer includes: a plurality of first wirings 11b; and a first insulating film 21b formed of $SiO_2$. The first wiring 11b is formed of Cu, in which a surface on the substrate 10 side and a side surface are covered with the barrier layer 5 formed of a Ti film or a TiN film. The first wiring 11b penetrates the first insulating film 21b and is embedded into the first insulating film 21b. As illustrated in FIG. 1, a part of the first wiring 11b is provided at a position overlapping the first wiring 11a of the 1-1 layer 1a in a plan view, and is in contact with a surface of the first wiring 11a on the second layer 2 side. Accordingly, a part of the first wiring 11b is electrically connected to the contact pad 10a of the substrate 10 through the first wiring 11a penetrating the 1-1 layer 1a.

The second layer 2 is provided on the first layer 1. As illustrated in FIG. 1, the second layer 2 has a two-layer structure in which a 2-1 layer 2a disposed on the first layer 1 side and a 2-2 layer 2b disposed on the third layer 3 side are stacked.

The 2-1 layer 2a includes a plurality of second wirings 12a (in FIG. 1, only one second wiring 12a is illustrated). The second wiring 12a is formed of Cu, in which a surface on the first layer 1 side and a side surface are covered with the barrier layer 5 formed of a Ti film or a TiN film. The second wiring 12a is a through wiring penetrating the 2-1 layer 2a. As illustrated in FIG. 1, each of the second wirings 12a is provided at a position overlapping the first wiring 11b of the 1-2 layer 1b in a plan view. Each of the second wirings 12a is in contact with the surface of the first wiring 11b on the second layer 2 side and is electrically connected to the first wiring 11b.

The 2-2 layer 2b includes a plurality of second wirings 12b. The second wiring 12b may be formed of Cu, in which a surface on the first layer 1 side and a side surface are covered with the barrier layer 5 formed of a Ti film or a TiN film. As illustrated in FIG. 1, a part of the second wiring 12b is provided at a position overlapping the second wiring 12a of the 2-1 layer 2a in a plan view, and is integrated with the second wiring 12a. Accordingly, a part of the second wiring 12b is electrically connected to the first wiring 11b of the 1-2 layer 1b through the second wiring 12a penetrating the 2-1 layer 2a.

As illustrated in FIG. 1, the second layer 2 includes a second insulating film formed of the insulating space 20. In the semiconductor device 100 illustrated in FIG. 1, the insulating space 20 functions as an insulating film that insulates adjacent second wirings 12a of the 2-1 layer 2a from each other, an insulating film that insulates adjacent second wirings 12b of the 2-2 layer 2b from each other, and an insulating film that insulates the second wiring 12b and the first wiring 11b of the 1-2 layer 1b from each other. The insulating space 20 is surrounded by an insulating film formed of an insulating material 24 that is continuously provided in the insulating space 20. As the insulating material 24, $SiO_2$ may be used. The insulating space 20 is filled with air of a pressure at or lower than atmospheric pressure.

The third layer 3 is provided on the second layer 2. The third layer 3 includes: a plurality of third wirings (not illustrated in FIG. 1); a third insulating film 23 formed of $SiO_2$; and a columnar body 25.

The third wirings function as an electrode for electrical connection between the semiconductor device 100 and an external apparatus according to some embodiments.

As illustrated in FIG. 1, the columnar body 25 is provided at a position not overlapping the wirings (the first wirings 11a and 11b and the second wirings 12a and 12b) in a plan view. The columnar body 25 may be circular in a plan view, extends in the third layer 3 in a first direction (vertical direction in FIG. 1), penetrates the insulating space 20, reaches the 1-2 layer 1b of the first layer 1, and has a bottom surface in the 1-2 layer 1b The columnar body 25 is filled with the insulating material 24. The insulating material 24 with which the columnar body 25 is filled is integrated with the insulating film provided in the insulating space 20.

In the semiconductor device 100 illustrated in FIG. 1, it is preferable that a thickness t of the insulating material 24 surrounding the insulating space 20 in a plan view is less than or equal to half of a diameter d of the columnar body 25 (insulating portion). During the manufacturing of the semiconductor device 100, in an insulating coating step for providing the insulating material 24 surrounding the insulating space 20, a through via hole as the columnar body 25 is filled with the insulating material 24. This provides that an insulating space forming step of enclosing air in the insulating space 20 at the atmospheric pressure or a pressure lower than the atmospheric pressure can be completed. Accordingly, the semiconductor device 100 can be more efficiently manufactured. In the semiconductor device 100, the effect of reducing the wiring capacitance obtained by the insulating space 20 can be prevented from being adversely affected by a very large thickness of the insulating material 24 surrounding the insulating space 20.

Next, a method of manufacturing the semiconductor device 100 illustrated in FIG. 1 will be described in detail using FIGS. 1 to 5.

In the embodiment, first, the first layer 1, a sacrificial material film-containing layer 20a (refer to FIG. 4), and the third layer 3 disposed on the sacrificial material film-containing layer 20a are provided on the substrate 10.

Figure 2:
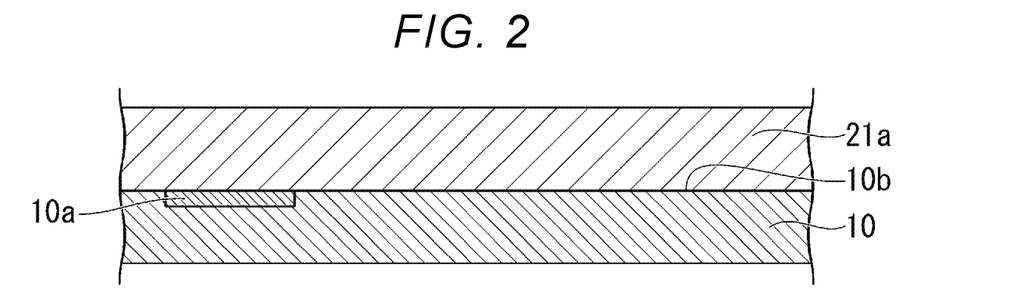
FIG. 2 is a schematic cross-sectional view illustrating an example of a method of manufacturing the semiconductor device illustrated in FIG. 1.

As illustrated in FIG. 2, the insulating region 10b and the contact pad 10a are provided on a surface of the substrate 10.

Figure 3:
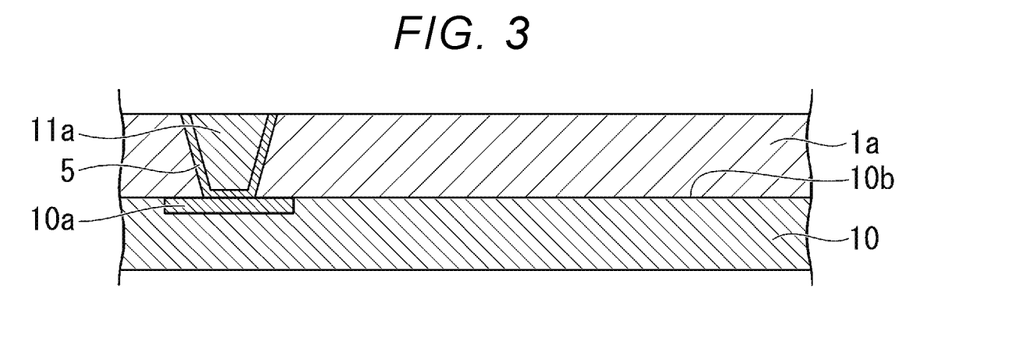
FIG. 3 is a schematic cross-sectional view illustrating the example of the method of manufacturing the semiconductor device illustrated in FIG. 1.

The first layer 1 may be provided, for example, using a damascene method as described below. First, the first insulating film 21a formed of an insulating material such as $SiO_2$ or SiN is provided on the surface of the substrate 10. Next, a contact hole is provided by patterning the first insulating film 21a, and the contact pad 10a is exposed. Next, the barrier layer 5 formed of a Ti film or a TiN film is provided on an inner surface of the contact hole and the first insulating film 21a. Next, Cu is embedded into the contact hole, the surface is planarized using a chemical mechanical polishing (CMP) method, and any unnecessary Cu and the barrier layer 5 on the first insulating film 21a are removed. As a result, as illustrated in FIG. 3, the 1-1 layer 1a including the first wiring 11a is provided.

Figure 4:
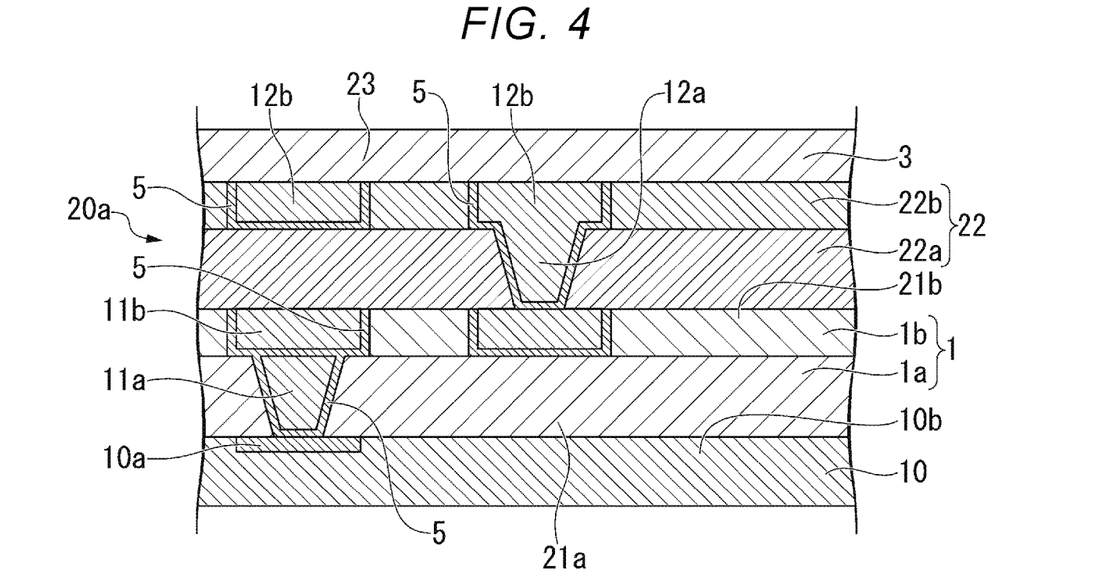
FIG. 4 is a schematic cross-sectional view illustrating the example of the method of manufacturing the semiconductor device illustrated in FIG. 1.

Next, the first insulating film 21b formed of $SiO_2$ is provided on the 1-1 layer 1a. As in the first wiring 11a of the 1-1 layer 1a, the 1-2 layer 1b including the first wiring 11b is provided using the damascene method. As a result, the first layer 1 is provided as illustrated in FIG. 4.

Next, the sacrificial material film-containing layer 20a is provided on the first layer 1. The sacrificial material film-containing layer 20a may be provided, for example, using a dual damascene method as described below. First, a sacrificial material film 22 including a first sacrificial material film 22a formed of SiN and a second sacrificial material film 22b formed of SiN is provided on the surface of the first layer 1. Next, the second sacrificial material film 22b is patterned. Next, a contact hole penetrating the first sacrificial material film 22a is provided in a recess portion of a wiring pattern of the second sacrificial material film 22b, and the first wiring 11b is exposed.

Next, the barrier layer 5 formed of a Ti film or a TiN film is provided in the contact hole of the first sacrificial material film 22a, in the wiring pattern of the second sacrificial material film 22b, and on the second sacrificial material film 22b. Next, Cu is embedded into the contact hole of the first sacrificial material film 22a and into the wiring pattern of the second sacrificial material film 22b. By planarizing the surface using the chemical mechanical polishing (CMP) method, unnecessary Cu and the barrier layer 5 on the second sacrificial material film 22b are removed. As a result, as illustrated in FIG. 4, the sacrificial material film-containing layer 20a including the second wirings 12a and 12b is provided.

Next, the third layer 3 is provided on the sacrificial material film-containing layer 20a. The third layer 3 may be manufactured using a method in which a plurality of third wirings (not illustrated) and the third insulating film 23 formed of $SiO_2$ are provided (refer to FIG. 4) on the surface of the sacrificial material film-containing layer 20a using a well-known method.

Figure 5:
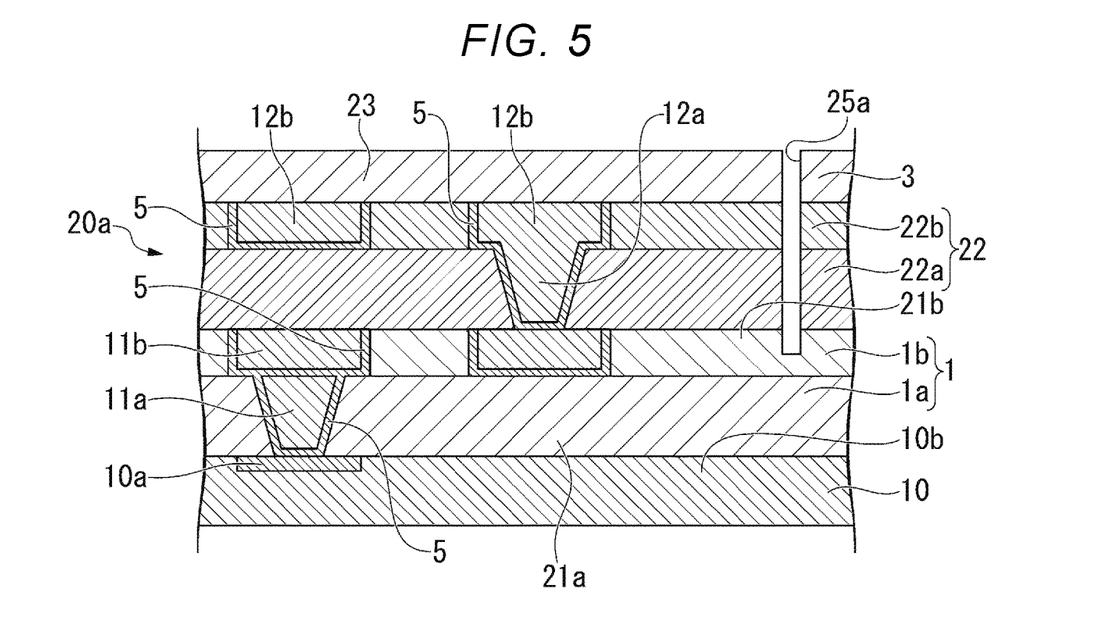
FIG. 5 is a schematic cross-sectional view illustrating the example of the method of manufacturing the semiconductor device illustrated in FIG. 1.

Next, in at least one embodiment, as illustrated in FIG. 5, a through via hole 25a that penetrates the third insulating film 23, the first sacrificial material film 22a, and the second sacrificial material film 22b and has a bottom surface in the first insulating film 21b is provided by dry etching. Conditions of the dry etching can be appropriately determined depending on materials for forming the third insulating film 23, the first sacrificial material film 22a, the second sacrificial material film 22b, and the first insulating film 21b.

In the embodiment, as illustrated in FIG. 5, the through via hole 25a having a bottom surface in the 1-2 layer 1b is provided. Therefore, the through via hole 25a may be provided using a method of performing dry etching using the first insulating film 21b as a stopper layer.

Next, a part or all of the first sacrificial material film 22a and the second sacrificial material film 22b is removed by wet etching through the through via hole 25a. As a result, a hole corresponding to the shape of the removed first sacrificial material film 22a and the removed second sacrificial material film 22b is provided (etching step).

An etchant used for the wet etching can be appropriately determined depending on a material of the third insulating film 23, a material of the first sacrificial material film 22a and the second sacrificial material film 22b, and a material for forming the first insulating film 21b, and a material and a thickness of the barrier layer 5. For example, when the third insulating film 23 and the first insulating film 21b are formed of $SiO_2$ and the first sacrificial material film 22a and the second sacrificial material film 22b are formed of SiN, it is preferable that $H_3PO_4$ is used as the etchant. A selection ratio of the third insulating film 23 and the first insulating film 21b to the first sacrificial material film 22a and the second sacrificial material film 22b in the wet etching increases, and a hole having a predetermined shape can be provided with high accuracy.

Next, in the embodiment, an inner surface of the hole provided by performing the etching step is coated with the insulating material 24 formed of $SiO_2$ through the through via hole 25a (insulating coating step), and air is enclosed in the hole at the atmospheric pressure or a pressure lower than the atmospheric pressure (insulating space forming step). It is preferable that a method of forming a film under a vacuum or low pressure condition, for example, an atomic layer deposition (ALD) method or a low pressure chemical vapor deposition (LPCVD) method is used as a method of coating the inner surface of the hole with the insulating material 24. When the method of forming a film under a vacuum or low pressure condition is used as the method of coating the inner surface of the hole with the insulating material 24, the insulating space 20 filled with air at a pressure lower than the atmospheric pressure can be easily and efficiently formed.

Specifically, it is preferable to provide the columnar body 25 by coating the inner surface of the hole with the insulating material 24 using an ALD method or a LPCVD method and concurrently coating the through via hole 25a with the insulating material 24, and filling the through via hole 25a with the insulating material 24. Here, the hole is filled with the insulating material 24 in a state where the hole is filled with air at a pressure lower than the atmospheric pressure. Accordingly, by using an ALD method or a LPCVD method, the insulating space 20 filled with air at a pressure lower than the atmospheric pressure can be easily formed. By using an ALD method or a LPCVD method, the insulating coating step and the insulating space forming step can be performed at the same time. Therefore, the semiconductor device 100 can be efficiently manufactured.

The film formed using an ALD method or a LPCVD method has excellent step coverage. Therefore, by removing a part or the entirety of the first sacrificial material film 22a and the second sacrificial material film 22b by etching, electromigration in the second wirings 12a and 12b exposed to the inner surface of the hole can be effectively prevented by the coating formed of the insulating material 24. In particular, when the inner surface of the hole is coated with $SiO_2$ by a method of decomposing TEOS (tetraethyl orthosilicate ($Si(OC_2H_5)_4$)) using a LPCVD method, a $SiO_2$ film having excellent step coverage can be obtained, which is preferable.

Through the above-described steps, the semiconductor device 100 illustrated in FIG. 1 can be obtained.

The semiconductor device 100 illustrated in FIG. 1 includes: a plurality of wirings (the first wirings 11a and 11b and the second wirings 12a and 12b); and the insulating space 20 disposed between the wirings adjacent to each other (between the second wirings 12a, between the second wirings 12b, and between the first wiring 11b and the second wiring 12b) and is surrounded by the insulating material 24, and the insulating space 20 is filled with air at the atmospheric pressure or a pressure lower than the atmospheric pressure. The relative dielectric constant of air at the atmospheric pressure or a pressure lower than the atmospheric pressure is about 1. Therefore, the relative dielectric constant of the insulating space 20 is lower than that of a general insulating material such as $SiO_2$ (relative dielectric constant: about 4). Accordingly, in the semiconductor device 100 illustrated in FIG. 1, the wiring capacitance is lower than that, for example, when an insulating layer formed of a general insulating material is disposed instead of the insulating space 20.

Specifically, the semiconductor device 100 illustrated in FIG. 1 includes: the second layer 2 including the second wirings 12a and 12b and the second insulating film formed of the insulating space 20; and the third layer 3 disposed on the second layer 2 and including the third insulating film 23, and the second wirings 12a adjacent to each other and the second wirings 12b adjacent to each other are insulated from each other by the insulating space 20. Accordingly, the capacitance between the second wirings 12a adjacent to each other and the capacitance between the second wirings 12b adjacent to each other are lower than that when an insulating layer formed of a general insulating material is disposed instead of the insulating space 20, and the semiconductor device 100 having a low wiring capacitance can be obtained.

In the semiconductor device 100 illustrated in FIG. 1, the second layer 2 has the two-layer structure in which the 2-1 layer 2a and the 2-2 layer 2b are stacked, and the insulating space 20 is disposed between the second wiring 12b in the 2-1 layer 2b and another wiring (the first wiring 11b of the first layer 1) adjacent to the second wiring 12b in a stacking direction. Accordingly, the capacitance between the first wiring 11b and the second wiring 12b is lower than that when an insulating layer formed of a general insulating material is disposed instead of the insulating space 20, and the semiconductor device 100 having a low wiring capacitance can be obtained.

The method of manufacturing the semiconductor device 100 according to at least one embodiment includes: the step of providing the sacrificial material film-containing layer 20a in which the sacrificial material film 22 is disposed between wirings adjacent to each other (between the second wirings 12a, between the second wirings 12b, and between the first wiring 11b and the second wiring 12b); the step of providing the third insulating film 23 on the sacrificial material film-containing layer 20a; the etching step of providing the through via hole 25a that penetrates the third insulating film 23 and removing the sacrificial material film 22 by etching through the through via hole 25a to form a hole; the insulating coating step of coating the inner surface of the hole with the insulating material 24 through the through via hole 25a; and the insulating space forming step of enclosing air in the hole at the atmospheric pressure or a pressure lower than the atmospheric pressure.

That is, in the method of manufacturing the semiconductor device 100 according to at least one embodiment, by performing the etching step, the insulating coating step, and the insulating space forming step, the sacrificial material film 22 disposed between the wirings adjacent to each other can be replaced with the insulating space 20 filled with air at the atmospheric pressure or a pressure lower than the atmospheric pressure. As a result, the semiconductor device 100 with the insulating space 20 can have a lower wiring capacitance compared to when an insulating layer formed of a general insulating material is disposed.

Second Embodiment

Figure 6:
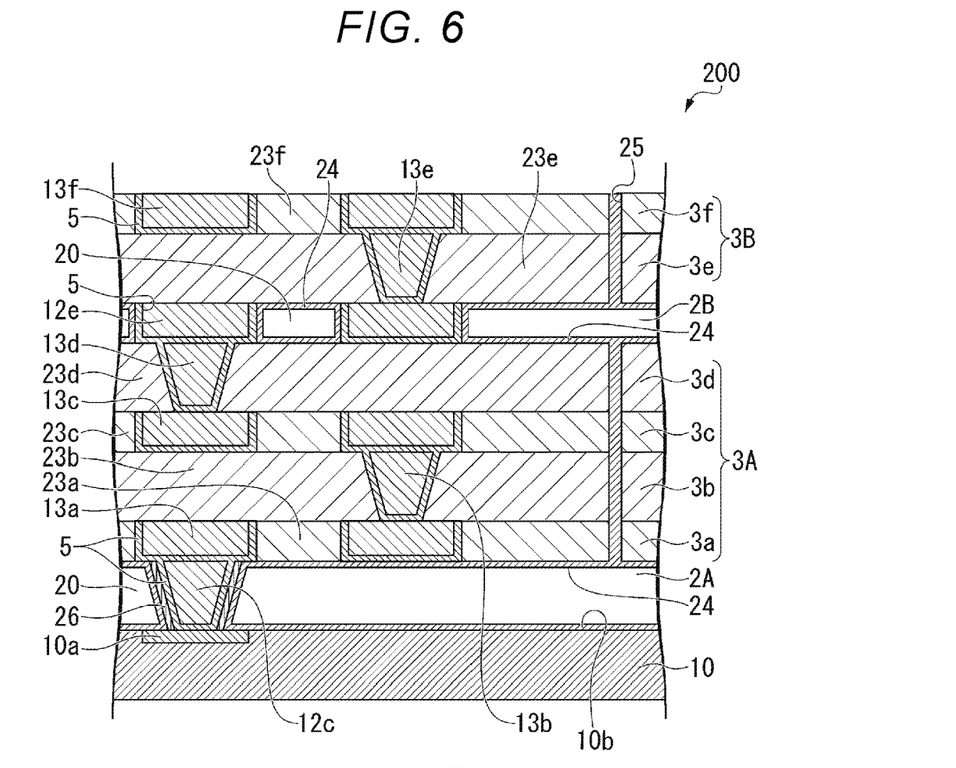
FIG. 6 is a schematic cross-sectional view illustrating a semiconductor device according to a second embodiment.

FIG. 6 is a schematic cross-sectional view illustrating a semiconductor device according to a second embodiment. A semiconductor device 200 illustrated in FIG. 6 includes: the substrate 10; second layers 2A and 2B including the insulating space 20; a third layer 3A disposed on a side of the second layer 2A opposite to the substrate 10 that is the substrate 10 side of the second layer 2B; and a third layer 3B disposed on a side of the second layer 2B opposite to the substrate 10.

As the substrate 10, as in the semiconductor device 100 according to the first embodiment illustrated in FIG. 1, for example, a silicon wafer on which elements such as a transistor are provided may be used. In the semiconductor device 200 illustrated in FIG. 6, an insulating region 10b formed of $SiO_2$ and the contact pad 10a are provided on a surface of the substrate 10. As the contact pad 10a, as in the semiconductor device 100 according to the first embodiment illustrated in FIG. 1, for example, a contact pad formed of a well-known conductive material such as $CoSi_2$ or $NiSi_2$ may be used.

As illustrated in FIG. 6, the second layer 2A is provided on the substrate 10. In addition, the second layer 2B is provided between the third layer 3A and the third layer 3B.

Each of the second layers 2A and 2B includes a plurality of second wirings 12c and 12e. The second wirings 12c and 12e are formed of Cu, in which a surface on the substrate 10 side and a side surface are covered with the barrier layer 5 formed of a Ti film or a TiN film.

A liner layer 26 formed of a $Ta_2O_5$ film or an $HfO_2$ film may be provided outside of the barrier layer 5 provided on the side surface in the second wiring 12c of the second layer 2A. The $Ta_2O_5$ film and the $HfO_2$ film have excellent resistance to $H_3PO_4$. Accordingly, when the hole as the insulating space 20 is provided by using $H_3PO_4$ as the etchant, contact between the second wiring 12c and the etchant can be prevented by the liner layer 26, which is preferable. In particular, when the thickness of the barrier layer 5 provided on the side surface of the second wiring 12c is not sufficiently large, it is preferable that the liner layer 26 is provided in order to prevent contact between the second wiring 12c and the etchant.

The second wiring 12c is a through wiring penetrating the second layer 2A. As illustrated in FIG. 6, each of the second wirings 12c is provided at a position overlapping the contact pad 10a of the substrate 10 in a plan view. The surface of each of the second wirings 12c on the substrate 10 side is in contact with the contact pad 10a. Each of the second wirings 12c is electrically connected to the contact pad 10a.

The second wiring 12e of the second layer 2B penetrates the second layer 2B. As illustrated in FIG. 6, a part of the second wiring 12e is provided at a position overlapping a third wiring 13d of the third layer 3A in a plan view, and is in contact with a surface of the third wiring 13d on the second layer 2B side. A part of the second wiring 12e is provided at a position overlapping a third wiring 13e of the third layer 3B in a plan view, and is in contact with a surface of the third wiring 13e on the second layer 2B side.

Each of the second layers 2A and 2B includes the second insulating film as the insulating space 20. In the semiconductor device 200 illustrated in FIG. 6, the insulating space 20 of the second layer 2A insulates adjacent second wirings 12c from each other, and the insulating space 20 of the second layer 2B insulates adjacent second wirings 12e from each other. The insulating space 20 is surrounded by an insulating film formed of the insulating material 24 that is continuously provided in the insulating space 20. As the insulating material 24, $SiO_2$ may be used. The insulating space 20 is filled with air at the atmospheric pressure or a pressure lower than the atmospheric pressure.

As illustrated in FIG. 6, the third layer 3A is provided on the second layer 2A on the substrate 10 side. As illustrated in FIG. 6, the third layer 3A has a four-layer structure in which a 3-1 layer 3a, a 3-2 layer 3b, a 3-3 layer 3c, and a 3-4 layer 3d are stacked in order from the second layer 2A side. The third layer 3B is provided on the second layer 2B. As illustrated in FIG. 6, the third layer 3B has a two-layer structure in which a 3-5 layer 3e and a 3-6 layer 3f are stacked in order from the second layer 2B side.

The 3-1 layer 3a to the 3-6 layer 3f include a plurality of third wirings 13a to 13f and third insulating films 23a to 23f formed of $SiO_2$, respectively. The third wirings 13a to 13f are formed of Cu, in which a surface on the substrate 10 side and a side surface are covered with the barrier layer 5 formed of a Ti film or a TiN film. The third wirings 13a to 13f penetrate the third insulating films 23a to 23f, respectively. As illustrated in FIG. 6, the third wirings 13a to 13f are in contact with wirings in layers on the substrate 10 side, and/or on a side opposite to the substrate 10, of the layers where the third wirings 13a to 13f are provided respectively.

As illustrated in FIG. 6, the columnar body 25 is provided at a position not overlapping the wirings (the second wirings 12c and 12e and the third wirings 13a to 13f) in a plan view. The columnar body 25 is circular in a plan view, penetrates the third layers 3A and 3B and the insulating space 20 of the second layer 2B, and reaches the insulating space 20 of the second layer 2A. The columnar body 25 is filled with the insulating material 24. The insulating material 24 with which the columnar body 25 is filled is integrated with the insulating film provided in the insulating space 20. In the semiconductor device 200 illustrated in FIG. 6, it is preferable that a thickness of the insulating material 24 surrounding the insulating space 20 in a plan view is less than or equal to half of a diameter of the columnar body 25 (insulating portion).

Next, a method of manufacturing the semiconductor device 200 illustrated in FIG. 6 will be described in detail using FIGS. 7 to 10.

In the embodiment, first, a sacrificial material film-containing layer 20b, the third layer 3A, a sacrificial material film-containing layer 20c, and the third layer 3B are provided on the substrate 10 in this order.

Figure 7:
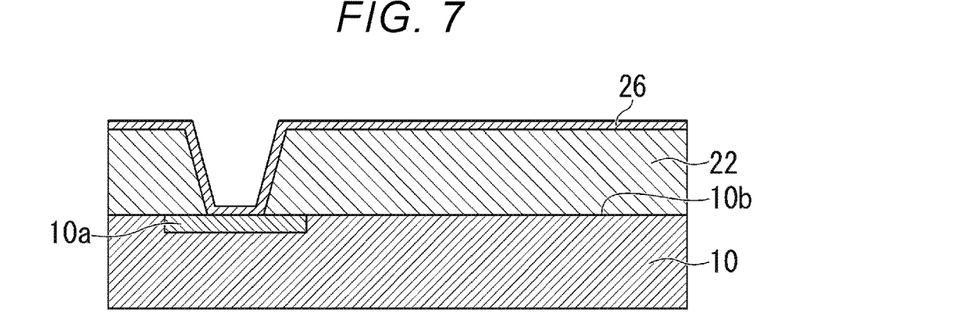
FIG. 7 is a schematic cross-sectional view illustrating an example of a method of manufacturing the semiconductor device illustrated in FIG. 6.
Figure 8:
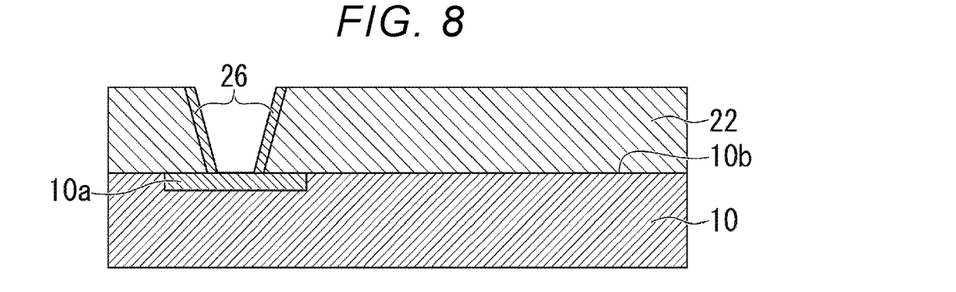
FIG. 8 is a schematic cross-sectional view illustrating the example of the method of manufacturing the semiconductor device illustrated in FIG. 6.

As illustrated in FIG. 7, the insulating region 10b and the contact pad 10a are provided on a surface of the substrate 10.

The sacrificial material film-containing layer 20b may be provided, for example, using the damascene method as described below. In the embodiment, the sacrificial material film 22 formed of SiN is provided on the surface of the substrate 10. Next, the sacrificial material film 22 is patterned. Next, as illustrated in FIG. 7, the liner layer 26 formed of a $Ta_2O_5$ film or an $HfO_2$ film is provided on the sacrificial material film 22. Next, for example, using a method of selectively removing a part of the liner layer 26 using a reactive ion etching (RIE) method, the liner layer 26 is removed excluding the liner layer 26 on a side surface in the recess portion of the wiring pattern of the sacrificial material film 22, and the contact pad 10a is exposed to the bottom surface of the recess portion of the sacrificial material film 22 (refer to FIG. 8).

Figure 9:
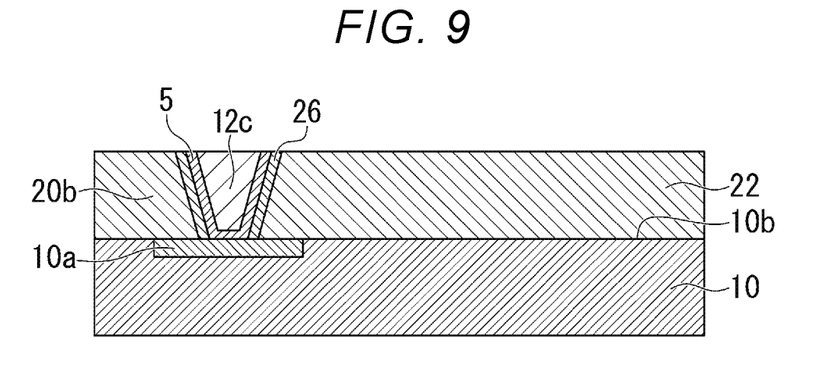
FIG. 9 is a schematic cross-sectional view illustrating the example of the method of manufacturing the semiconductor device illustrated in FIG. 6.

Next, the barrier layer 5 formed of a Ti film or a TiN film is provided in the recess portion of the sacrificial material film 22 and on the sacrificial material film 22. Next, Cu is embedded into the recess portion of the wiring pattern of the sacrificial material film 22. By planarizing the surface using chemical mechanical polishing (CMP) method, any unnecessary Cu and the barrier layer 5 on the sacrificial material film 22 are removed. As a result, as illustrated in FIG. 9, the sacrificial material film-containing layer 20b including the second wiring 12c is provided.

Next, each of the 3-1 layer 3a to the 3-4 layer 3d of the third layer 3A is provided on the sacrificial material film-containing layer 20b, for example, using the same method as the method of providing the 1-1 layer 1a of the semiconductor device 100 according to the first embodiment.

Next, the sacrificial material film-containing layer 20c is provided on the third layer 3A, for example, using the damascene method as described below. First, the sacrificial material film 22 formed of SiN is provided on the surface of the third layer 3A. Next, the sacrificial material film 22 is patterned, and the third wiring 13d of the third layer 3A is exposed to the inside of the recess portion of the wiring pattern of the sacrificial material film 22.

Next, the barrier layer 5 formed of a Ti film or a TiN film is provided in the wiring pattern of the sacrificial material film 22 and on the sacrificial material film 22. Next, Cu is embedded into the wiring pattern of the sacrificial material film 22. By planarizing the surface using chemical mechanical polishing (CMP) method, any unnecessary Cu and the barrier layer 5 on the sacrificial material film 22 are removed. As a result, as illustrated in FIG. 10, the sacrificial material film-containing layer 20c including the second wirings 12e is provided.

Next, each of the 3-5 layer 3e and the 3-6 layer 3f of the third layer 3B is provided on the sacrificial material film-containing layer 20c, for example, using the same method as that for providing the 1-1 layer 1a of the semiconductor device 100 according to the first embodiment.

Figure 10:
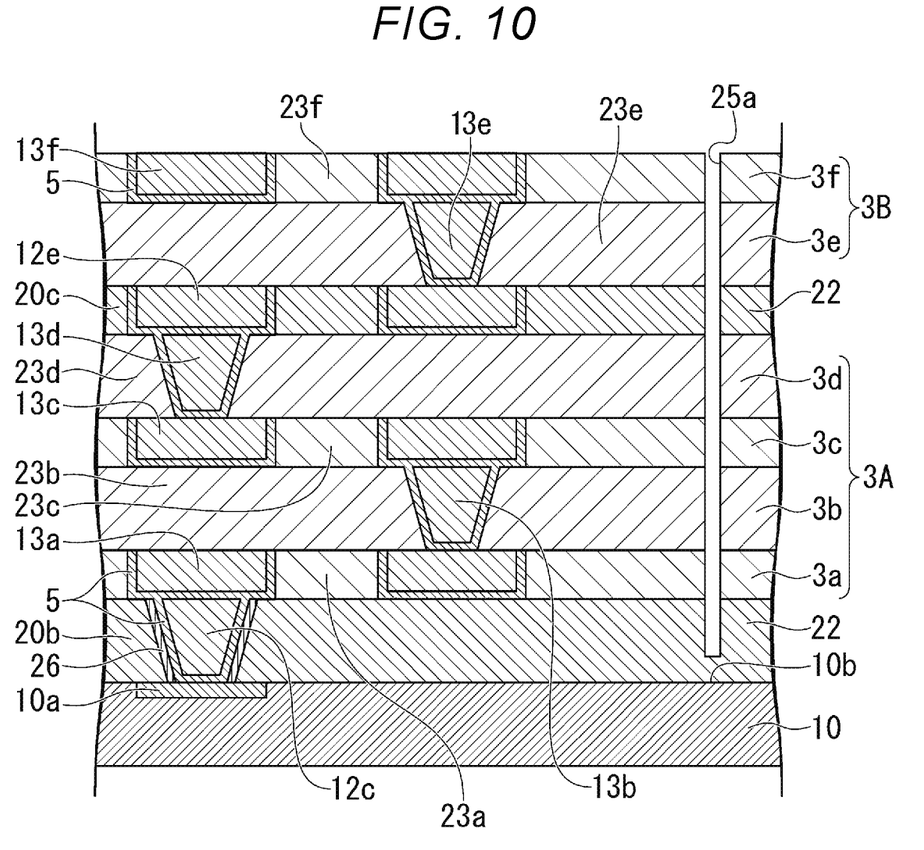
FIG. 10 is a schematic cross-sectional view illustrating the example of the method of manufacturing the semiconductor device illustrated in FIG. 6.

Next, in at least one embodiment, as illustrated in FIG. 10, the through via hole 25a that penetrates the third layer 3B, the sacrificial material film-containing layer 20C, and the third layer 3A and has a bottom surface in the sacrificial material film-containing layer 20b is provided by dry etching. Conditions of the dry etching can be appropriately determined depending on materials for forming the third insulating films 23a to 23f, the sacrificial material film 22, and the insulating region 10b of the substrate 10.

Next, a part or the entirety of the sacrificial material film 22 of the sacrificial material film-containing layer 20b and a part or the entirety of the sacrificial material film 22 of the sacrificial material film-containing layer 20c are removed by wet etching through the through via hole 25a at the same time. As a result, a hole corresponding to the shape of the removed sacrificial material film 22 is provided (etching step).

The etchant used for the wet etching can be appropriately determined depending on a material of the third insulating films 23a to 23f, a material of the sacrificial material film 22, a material of the insulating region 10b of the substrate 10, a material and a thickness of the liner layer 26, and a material and a thickness of the barrier layer 5. For example, when the third insulating films 23a to 23f and the insulating region 10b of the substrate are formed of $SiO_2$ and the sacrificial material film 22 is formed of SiN, it is preferable that $H_3PO_4$ is used as the etchant. Here, a selection ratio of the third insulating films 23a to 23f and the insulating region 10b of the substrate 10 to the sacrificial material film 22 in the wet etching increases, and a hole having a predetermined shape can be provided with high accuracy.

Next, the insulating coating step and the insulating space forming step are performed as in the first embodiment.

Through the above-described steps, the semiconductor device 200 illustrated in FIG. 6 can be obtained.

The semiconductor device 200 illustrated in FIG. 6 includes: the second wirings 12c; the insulating space 20 disposed between wirings adjacent to each other; the second wirings 12e; and the insulating space 20 disposed between wirings adjacent to each other, and the insulating space 20 is surrounded by the insulating material 24 and is filled with air at the atmospheric pressure or a pressure lower than the atmospheric pressure. Accordingly, in the semiconductor device 200 illustrated in FIG. 6, the wiring capacitance is lower than that, for example, when an insulating layer formed of a general insulating material is disposed instead of the insulating space 20.

Specifically, the semiconductor device 200 illustrated in FIG. 6 includes: the second layer 2A including the second wirings 12c and the second insulating film as the insulating space 20 that insulates the adjacent second wirings 12c from each other; and the third layer 3A disposed on the second layer 2A and including the third insulating films 23a to 23d. The semiconductor device 200 illustrated in FIG. 6 includes: the second layer 2B including the second wirings 12e and the second insulating film as the insulating space 20 that insulates the second wirings 12e from each other; and the third layer 3 disposed on the second layer 2B and including the third insulating films 23e and 23f.

Accordingly, the capacitance between the second wirings 12c adjacent to each other and the capacitance between the second wirings 12d adjacent to each other are lower than that when an insulating layer formed of a general insulating material is disposed instead of the insulating space 20 included in the second layer 2A and the second layer 2B, and the semiconductor device 200 having a low wiring capacitance can be obtained.

In the semiconductor device 200 illustrated in FIG. 6, the two second layers 2A and 2B each of which includes the insulating space 20 are provided. Accordingly, in the semiconductor device 200 according to at least one embodiment, a wiring capacitance is lower than that, for example, when the second layer has a single-layer structure.

The method of manufacturing the semiconductor device 200 according to at least one embodiment includes: the step of providing the sacrificial material film-containing layer 20b in which the sacrificial material film 22 is disposed between wirings adjacent to each other (between the second wirings 12c adjacent to each other); the step of providing the third layer 3A including the third insulating films 23a to 23d on the sacrificial material film-containing layer 20b; the step of providing the sacrificial material film-containing layer 20c in which the sacrificial material film 22 is disposed between wirings adjacent to each other (between the second wirings 12e adjacent to each other); and the step of providing the third layer 3B including the third insulating films 23e and 23f on the sacrificial material film-containing layer 20c. Next, the etching step of providing the through via hole 25a that penetrates the third insulating films 23a to 23f and the sacrificial material film 22 of the sacrificial material film-containing layer 20c and removing the sacrificial material film 22 by etching through the through via hole 25a to form a hole; the insulating coating step of coating the inner surface of the hole with the insulating material 24 through the through via hole 25a; and the insulating space forming step of enclosing air in the hole at the atmospheric pressure or a pressure lower than the atmospheric pressure.

That is, in the method of manufacturing the semiconductor device 200 according to at least one embodiment, by performing the etching step, the insulating coating step, and the insulating space forming step, the sacrificial material film 22 disposed between the wirings adjacent to each other can be replaced with the insulating space 20 filled with air at the atmospheric pressure or a pressure lower than the atmospheric pressure. As a result, the semiconductor device 200 with the insulating space 20 has a lower wiring capacitance than that when an insulating layer formed of a general insulating material is disposed.

In the method of manufacturing the semiconductor device 200 according to at least one embodiment, by performing the etching step, the insulating coating step, and the insulating space forming step only once, the two second layers 2A and 2B each of which includes the insulating space 20 can be provided. That is, even when a semiconductor device including a plurality of second layers having the insulating space is manufactured, the number of steps is the same as that when only a single layer has the insulating space, and it is not necessary to increase the number of steps according to the number of layers having the insulating space. Accordingly, in the method of manufacturing the semiconductor device according to at least one embodiment, even a semiconductor device including a plurality of second layers having the insulating space can be efficiently manufactured.

Figure 11:
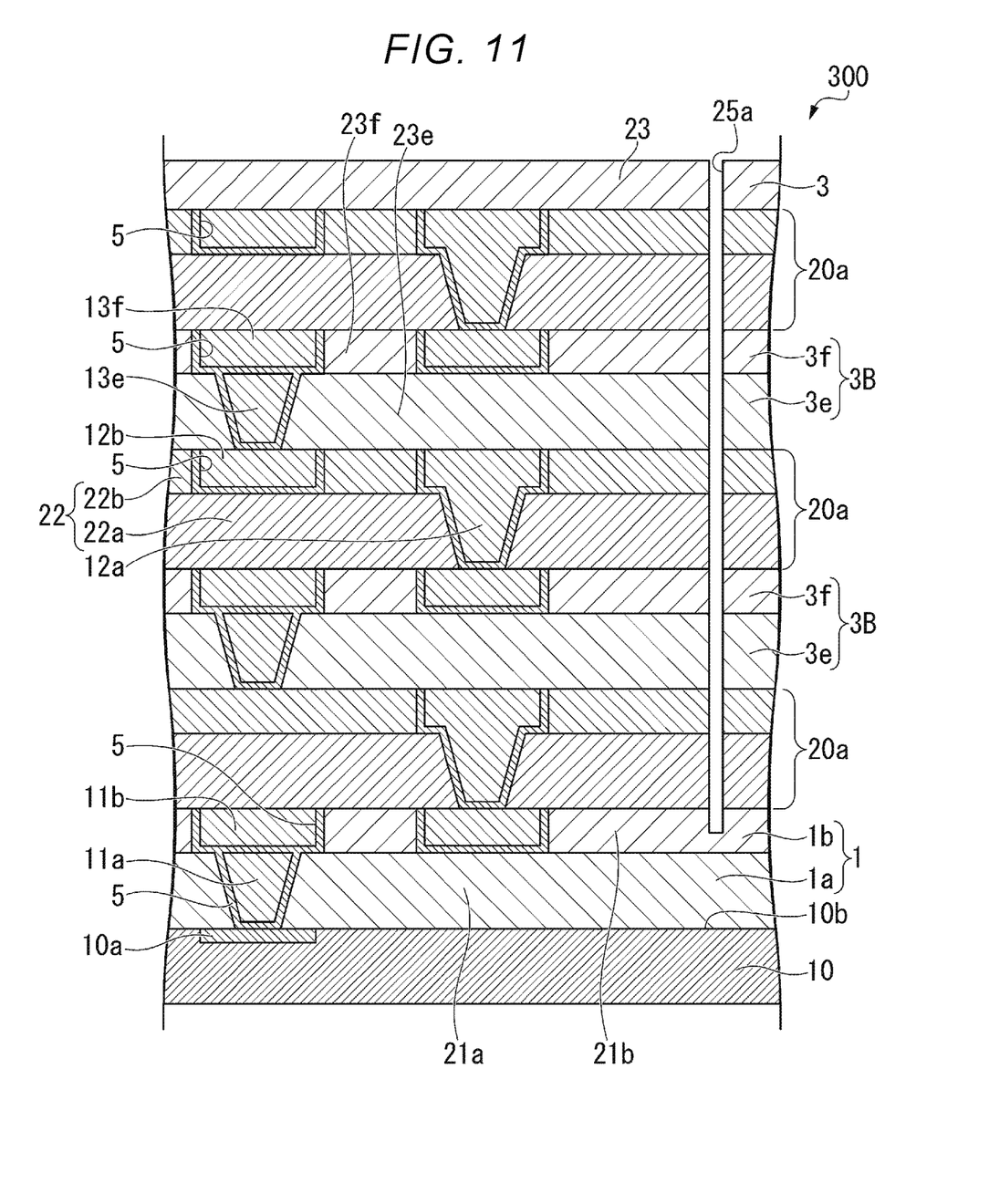
FIG. 11 is a schematic cross-sectional view illustrating another example of the semiconductor device according to at least one embodiment.
Figure 12:
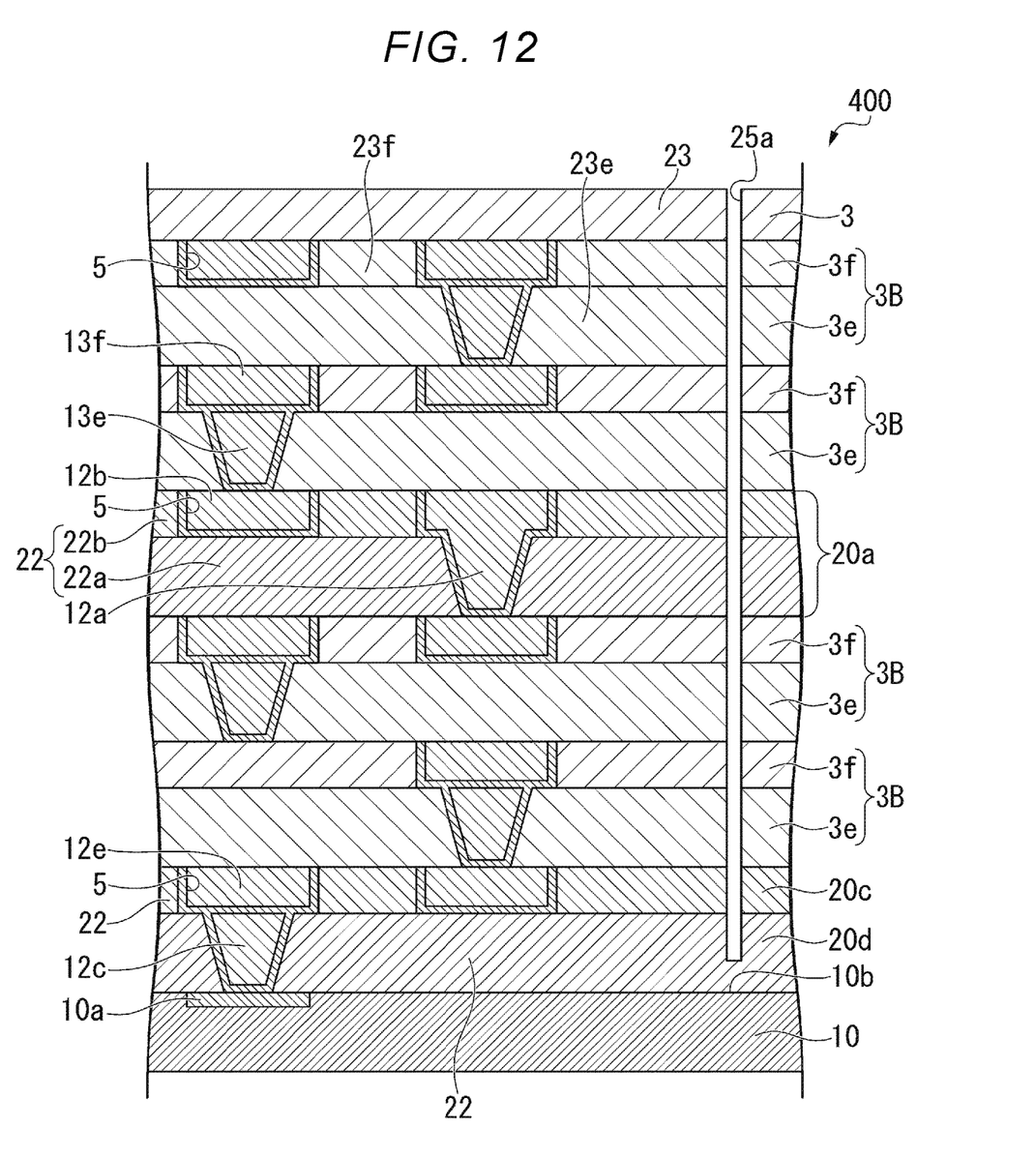
FIG. 12 is a schematic cross-sectional view illustrating still another example of the semiconductor device according to at least one embodiment.
Figure 13:
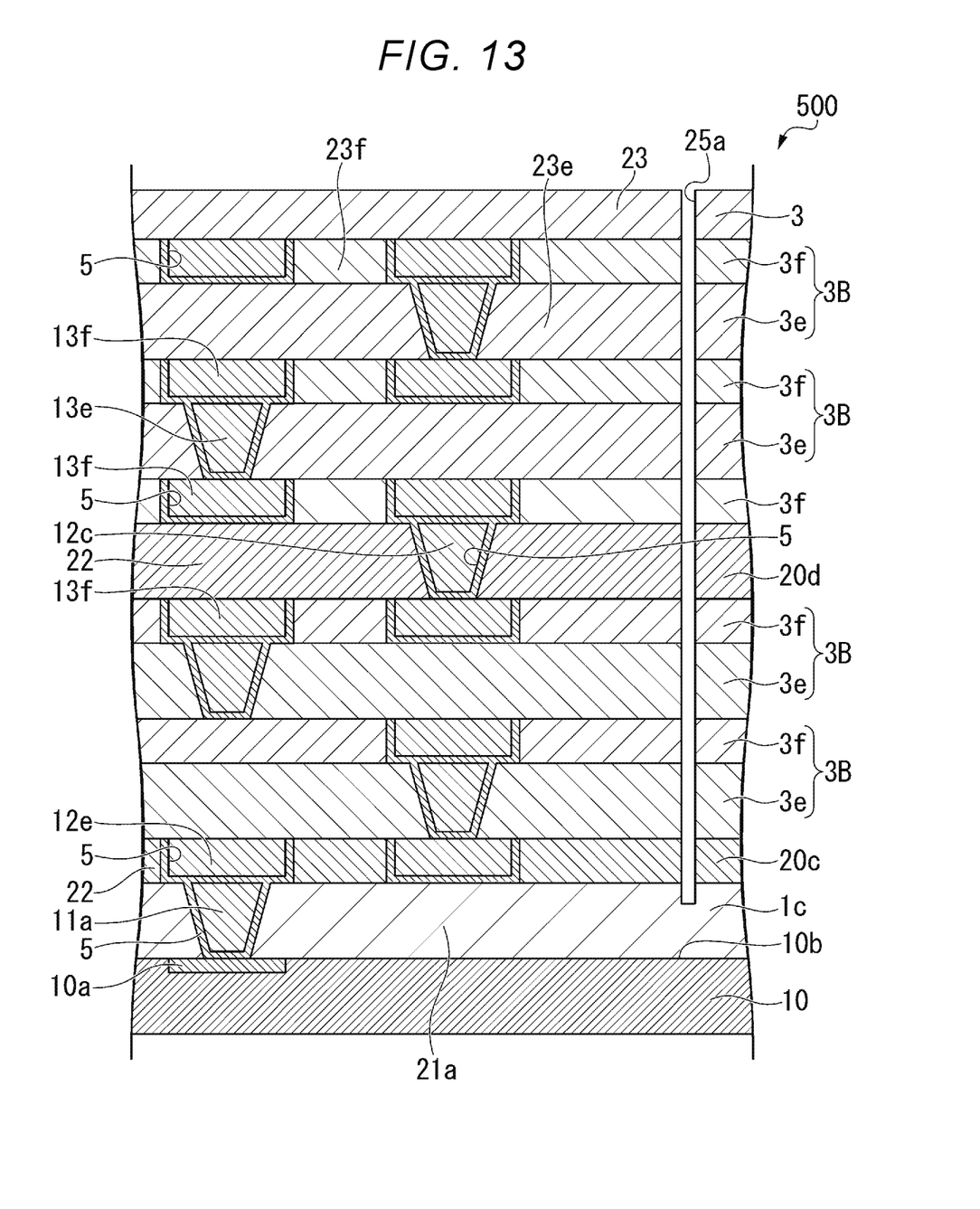
FIG. 13 is a schematic cross-sectional view illustrating still another example of the semiconductor device according to at least one embodiment.

In the description of the first embodiment, the single second layer, the single first layer disposed on the substrate side of the second layer, and the single third layer disposed on the side of the second layer opposite to the substrate are provided. In the description of the second embodiment, the two second layers and the two third layers are provided and are alternately stacked. However, for example, as illustrated in FIGS. 11 to 13, a semiconductor device may include three or more second layers and/or three or more third layers. When two or more second layers are provided, the third layer disposed between second layers adjacent to each other in the stacking direction also functions as the first layer.

FIGS. 11 to 13 are schematic cross-sectional views illustrating other examples of the semiconductor device according to the embodiment. FIGS. 11 to 13 illustrate the semiconductor devices that are being manufactured. FIGS. 11 to 13 illustrate states of the steps of manufacturing the semiconductor device before removing the sacrificial material film 22 by etching and after providing the through via hole 25a.

A semiconductor device 300 illustrated in FIG. 11 that is being manufactured includes the first layer 1 according to the first embodiment on the same substrate 10 as that of the semiconductor device 100 according to the first embodiment. As illustrated in FIG. 11, the two sacrificial material film-containing layers 20a according to the first embodiment and the two third layers 3B according to the second embodiment are alternately stacked on the first layer 1. As illustrated in FIG. 11, the sacrificial material film-containing layer 20a and the third layer 3 according to the first embodiment are stacked on a side of the third layer 3B opposite to the substrate 10. In the semiconductor device 300 illustrated in FIG. 11 that is being manufactured, the through via hole 25a that penetrates the third insulating film 23 of the third layer 3, the third insulating films 23e and 23f of the third layer 3B, and the sacrificial material film 22 of the sacrificial material film-containing layer 20a and has a bottom surface in the first insulating film 21b of the first layer 1 is provided.

The semiconductor device 300 illustrated in FIG. 11 includes three sacrificial material film-containing layers 20a as illustrated in FIG. 11. In at least one embodiment, the sacrificial material films 22 of the three sacrificial material film-containing layers 20a are replaced with the insulating spaces 20 by performing the etching step, the insulating coating step, and the insulating space forming step only once. As a result, the semiconductor device is obtained in which the two second layers 2 according to the first embodiment and the two third layers 3B according to the second embodiment are alternately stacked on the first layer 1 and the second layer 2 and the third layer 3 according to the first embodiment are stacked on the side of the third layer 3B opposite to the substrate 10. In the semiconductor device obtained as described above, as in the above-described embodiment, the wiring capacitance is lower than that, for example, when an insulating layer formed of a general insulating material is disposed instead of the insulating space 20.

A semiconductor device 400 illustrated in FIG. 12 that is being manufactured includes the same substrate 10 as that of the semiconductor device 200 according to the second embodiment. As illustrated in FIG. 12, a sacrificial material film-containing layer 20d is provided on the substrate 10. The sacrificial material film-containing layer 20d is the same as the sacrificial material film-containing layer 20b according to the second embodiment, except that the liner layer is not provided. Accordingly, the sacrificial material film-containing layer 20d can be provided using the same method as that of the sacrificial material film-containing layer 20b according to the second embodiment, except that the liner layer is not provided.

The sacrificial material film-containing layer 20c according to the second embodiment, the two third layers 3B according to the second embodiment, the sacrificial material film-containing layer 20a according to the first embodiment, the two third layers 3B according to the second embodiment, and the third layer 3 according to the first embodiment are stacked on the sacrificial material film-containing layer 20d illustrated in FIG. 12. In the semiconductor device 400 illustrated in FIG. 12 that is being manufactured, the through via hole 25a that penetrates the third insulating film 23 of the third layer 3, the third insulating films 23e and 23f of the third layer 3B, and the sacrificial material films 22 of the sacrificial material film-containing layers 20a and 20c and has a bottom surface in the sacrificial material film 22 of the sacrificial material film-containing layer 20d is provided.

In at least one embodiment, the sacrificial material films 22 of the sacrificial material film-containing layers 20a, 20c, and 20d in the semiconductor device 400 illustrated in FIG. 12 are replaced with the insulating spaces 20 by performing the etching step, the insulating coating step, and the insulating space forming step only once. As a result, the semiconductor device is obtained in which the second layer including the insulating space 20 that functions as the insulating film that insulates adjacent second wirings 12c of the sacrificial material film-containing layer 20d, and as the insulating film that insulates adjacent second wirings 12e of the sacrificial material film-containing layer 20c from each other, the two third layers 3B according to the second embodiment, the second layer 2 according to the first embodiment, the two third layers 3B, and the third layer 3 according to the first embodiment are stacked on the substrate 10. In the semiconductor device obtained as described above, as in the above-described embodiment, the wiring capacitance is lower than that when an insulating layer formed of a general insulating material is disposed instead of the insulating space 20.

A semiconductor device 500 illustrated in FIG. 13 that is being manufactured includes the same substrate 10 as that of the semiconductor device 100 according to the first embodiment. As illustrated in FIG. 13, a first layer 1c is provided on the substrate 10. The first layer 1c is the same as the 1-1 layer 1a of the first layer 1 according to the first embodiment, except that the first insulating film 21a formed of $SiO_2$ is provided and the through via hole 25a has a bottom surface in the first insulating film 21a.

The sacrificial material film-containing layer 20c according to the second embodiment, the two third layers 3B according to the second embodiment, the sacrificial material film-containing layer 20d illustrated in FIG. 12, the 3-6 layer 3f of the third layer 3B according to the second embodiment, the two third layers 3B according to the second embodiment, and the third layer 3 according to the first embodiment are stacked on the first layer 1c illustrated in FIG. 13. As illustrated in FIG. 13, the third wirings 13f in the 3-6 layer 3f that are disposed such that the sacrificial material film-containing layer 20d is interposed therebetween are disposed to face each other through the sacrificial material film-containing layer 20d. In the semiconductor device 500 illustrated in FIG. 13 that is being manufactured, the through via hole 25a that penetrates the third insulating film 23 of the third layer 3, the third insulating films 23e and 23f, and the sacrificial material films 22 of the sacrificial material film-containing layers 20c and 20d and has a bottom surface in the first insulating film 21a of the first layer 1c is provided.

In at least one embodiment, the sacrificial material films 22 of the sacrificial material film-containing layers 20c and 20d in the semiconductor device 500 illustrated in FIG. 13 are replaced with the insulating spaces 20 by performing the etching step, the insulating coating step, and the insulating space forming step only once. As a result, the semiconductor device is obtained in which the first layer 1c, the second layer including the insulating space 20 as the insulating film insulating adjacent second wirings 12e of the sacrificial material film-containing layer 20c from each other, the two third layers 3B according to the second embodiment, the second layer including the insulating space 20 as the insulating film insulating adjacent second wirings 12c of the sacrificial material film-containing layer 20d from each other, the 3-6 layer 3f of the third layer 3B according to the second embodiment, the two third layers 3B according to the second embodiment, and the third layer 3 according to the first embodiment are stacked on the substrate 10.

In the semiconductor device obtained as described above, as in the above-described embodiment, the wiring capacitance is lower than that when an insulating layer formed of a general insulating material is disposed instead of the insulating space 20. In the semiconductor device, the insulating space is disposed between the third wirings 13f that are disposed in the stacking direction to face each other with the sacrificial material film-containing layer 20d interposed therebetween. Accordingly, the capacitance between the third wirings 13f disposed to face each other is lower than that when an insulating layer formed of a general insulating material is disposed instead of the insulating space. This provides for a semiconductor device having a low wiring capacitance.

In the description of the first embodiment, the first layer has the two-layer structure. In the description of the second embodiment, the first layer is not provided. However, the number of first layers may be one or three or more.

In the description of the first embodiment, the second layer has the two-layer structure. In the description of the second embodiment, only one second layer is provided. However, the number of second layers may be three or more.

In the description of the first embodiment and the second embodiment, the columnar body 25 having a circular shape in a plan view is provided. However, the shape of the columnar body in a plan view is not limited to a circular shape. For example, the columnar body 25 may have a rectangular groove shape in a plan view.

In FIGS. 1 and 6, only one columnar body 25 is provided. In FIGS. 11 to 13, only one through via hole 25a that is the columnar body when filled with insulating material is provided. However, the number of columnar bodies (through via holes) in the semiconductor device according to the embodiment may be one or plural and can be appropriately determined depending on the area of the semiconductor device in a plan view, the number of insulating spaces, etching conditions of the sacrificial material film, and the like.

In the description of the first embodiment and the second embodiment, the insulating film is formed of $SiO_2$, the sacrificial material film is formed of SiN, and the etchant including $H_3PO_4$ is used. However, a combination of the insulating film, the sacrificial material film, and the etchant is not limited to the example. For example, when the insulating film is formed of $SiO_2$ and the sacrificial material film is formed of polysilicon, a choline solution (2-hydroxyethyltrimethylammonium hydroxide aqueous solution) may be used as the etchant.

In the description of the first embodiment and the second embodiment, the wiring is formed of Cu, in which a surface on the substrate side and a side surface are covered with the barrier layer formed of a Ti film or a TiN film. However, the wiring may be formed of a well-known material and is not limited to the wiring formed of the above-described material and having the above-described structure.

In the description of the second embodiment, the liner layer 26 is formed of a $Ta_2O_5$ film or an $HfO_2$ film. The material of the liner layer can be appropriately determined depending on the composition of the etchant used for providing the hole as the insulating space, and the liner layer is not necessarily formed of a $Ta_2O_5$ film or an $HfO_2$ film.

The semiconductor device according to any one of the embodiments includes: a plurality of wirings; and an insulating space disposed between wirings adjacent to each other and surrounded by an insulating material, and the insulating space is filled with air at an atmospheric pressure or a pressure lower than the atmospheric pressure. As a result, the wiring capacitance of the semiconductor device is low.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a plurality of wirings;
an insulating space disposed between adjacent wirings of the plurality of wirings;
an insulating material surrounding the insulating space, wherein the insulating space is filled with air at a pressure no more than an atmospheric pressure;
a second layer including a plurality of second wirings and a second insulating film, the second insulating film insulates adjacent second wirings from each other; and
a third layer disposed on the second layer, the third layer including a third wiring and a third insulating film, wherein
the second insulating film encloses the insulating space.

2. The semiconductor device according to claim 1, wherein the insulating material includes silicon dioxide.

3. The semiconductor device according to claim 1, wherein the insulating material includes at least one of silicon nitride or silicon dioxide.

4. A semiconductor device comprising:
a plurality of wirings;
an insulating space disposed between adjacent wirings of the plurality of wirings;
an insulating material surrounding the insulating space, wherein the insulating space is filled with air at a pressure no more than an atmospheric pressure;
a first layer including a first wiring and a first insulating film;
a second layer disposed on the first layer, the second layer including a second wiring and a second insulating film;
a third layer disposed on the second layer, the third layer including a third wiring and a third insulating film, wherein the second insulating film disposed between the first wiring and the third wiring encloses the insulating space; and
an insulating portion extending in the third insulating film in a first direction and having one end extending to the insulating space, wherein a thickness of the insulating material surrounding the insulating space is less than or equal to half of a diameter of the insulating portion.

5. The semiconductor device according to claim 4, wherein the first layer has a two-layer structure including a first sub-layer and a second sub-layer, which are stacked.

6. The semiconductor device according to claim 5, wherein the first sub-layer and the second sub-layer are electrically connected.

7. The semiconductor device according to claim 4, wherein the first layer includes a barrier layer.

8. The semiconductor device according to claim 4, wherein the second wiring overlaps with the first wiring.

9. The semiconductor device according to claim 4, wherein the second wiring is electrically connected to the first wiring.

10. The semiconductor device according to claim 4, wherein the insulating portion include a columnar body.

11. The semiconductor device according to claim 10, wherein the columnar body has one of a circular or a rectangular cross-section.

12. A semiconductor device comprising:
a plurality of wirings;
an insulating space disposed between adjacent wirings of the plurality of wirings;
an insulating material surrounding the insulating space, wherein the insulating space is filled with air at a pressure no more than an atmospheric pressure;
a first layer including a first wiring and a first insulating film;
a second layer disposed on the first layer, the second layer including a second wiring and a second insulating film;
a third layer disposed on the second layer, the third layer including a third wiring and a third insulating film, wherein the second insulating film disposed between the first wiring and the third wiring encloses the insulating space;
wherein
the second layer has a two-layer structure, the two-layer structure including a third sub-layer and a fourth sub-layer, which are stacked, and
the insulating space is disposed between the second wiring in the third sub-layer or the fourth sub-layer, and another wiring adjacent to the second wiring in a stacking direction.

* * * * *